US011551981B2

(12) United States Patent
Rieske et al.

(10) Patent No.: US 11,551,981 B2
(45) Date of Patent: Jan. 10, 2023

(54) METHOD AND APPARATUS FOR PRODUCING AT LEAST ONE MODIFICATION IN A SOLID BODY

(71) Applicant: Infineon Technologies AG, Neubiberg (DE)

(72) Inventors: Ralf Rieske, Dresden (DE); Marko Swoboda, Dresden (DE); Albrecht Ullrich, Dresden (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 16/856,258

(22) Filed: Apr. 23, 2020

(65) Prior Publication Data

US 2020/0343147 A1 Oct. 29, 2020

(30) Foreign Application Priority Data

Apr. 24, 2019 (DE) .......................... 102019205847.7

(51) Int. Cl.
*H01L 21/66* (2006.01)
*H01L 21/268* (2006.01)
*H01L 21/78* (2006.01)

(52) U.S. Cl.
CPC ............ *H01L 22/12* (2013.01); *H01L 21/268* (2013.01); *H01L 21/7806* (2013.01); *H01L 22/20* (2013.01)

(58) Field of Classification Search
CPC ..... H01L 22/12; H01L 22/20; H01L 21/7806; H01L 21/268; H01L 21/67253; B23K 26/03; B23K 26/53
See application file for complete search history.

(56) References Cited

U.S. PATENT DOCUMENTS 5,900,633 A * 5/1999 Solomon ............ G01B 11/0625
356/73
6,048,742 A * 4/2000 Weyburne ......... H01L 21/67253
438/16

(Continued)

FOREIGN PATENT DOCUMENTS

DE   102007061248 B4   8/2016
EP        2729099 B1   11/2019

(Continued)

OTHER PUBLICATIONS

Corresponding Japanese Application No. 2020179425, Japanese Office action dated Apr. 5, 2021.

*Primary Examiner* — Michael M Trinh
(74) *Attorney, Agent, or Firm* — Cooper Legal Group LLC (57) ABSTRACT

A method and apparatus are provided. In an example, a volume portion of the solid body is exposed to light waves of different wavelengths, wherein the light waves are partly reflected at surfaces of the solid body. Light parameters of the reflected light waves are at least partly acquired using a sensor device. Distance information and/or intensity information are/is ascertained from at least a portion of the acquired light parameters. A thickness and/or a transmittance of the solid body in the volume portion are/is determined based upon the distance information and/or the intensity information. Laser radiation is introduced into the volume portion to produce a modification in the interior of the solid body, wherein at least one laser parameter of the laser radiation is set at least depending on the thickness and/or the transmittance such that the modification is at a predefined distance from a surface of the solid body.

18 Claims, 2 Drawing Sheets

(56) References Cited

U.S. PATENT DOCUMENTS

| | | | | |
|---|---|---|---|---|
| 6,676,878 B2* | 1/2004 | O'Brien | ................. | B23K 26/40 |
| | | | | 219/121.81 |
| 7,307,735 B2* | 12/2007 | Hecht | .................... | G01B 11/22 |
| | | | | 356/504 |
| 8,299,397 B2* | 10/2012 | Ito | ...................... | B23K 26/0665 |
| | | | | 219/121.72 |
| 9,285,211 B2* | 3/2016 | Nomaru | ............. | G01B 11/0608 |
| 9,837,315 B2* | 12/2017 | Fukuyo | ................. | B23K 20/26 |
| 2018/0277435 A1* | 9/2018 | Fujita | .................... | H01L 21/268 |
| 2020/0173767 A1* | 6/2020 | Nishida | ............. | G01B 11/0691 |
| 2020/0208963 A1* | 7/2020 | Kimura | ................. | G01B 11/06 |
| 2020/0217641 A1* | 7/2020 | Kimura | ............. | G01B 11/0608 |

FOREIGN PATENT DOCUMENTS

| | | |
|---|---|---|
| JP | 2012-164801 A | 8/2012 |
| JP | 2013-258253 A | 12/2013 |
| JP | 2017-159369 A | 9/2017 |
| JP | 2018-036213 A | 3/2018 |
| WO | 2017/060251 A1 | 4/2017 |

\* cited by examiner

METHOD AND APPARATUS FOR PRODUCING AT LEAST ONE MODIFICATION IN A SOLID BODY

RELATED APPLICATION

This application claims priority to German Patent Application No. 102019205847.7, filed on Apr. 24, 2019, entitled "Verfahren and Vorrichtung zur Erzeugung mindestens einer Modifikation in einem Festkörper", which is incorporated by reference herein in its entirety.

TECHNICAL FIELD

The subjects described below are in the technical field of semiconductor processing, for example, in the field of ingot or wafer or boule processing. The processing constitutes for example reducing the thickness of the solid body being treated, such as dividing the solid body into a plurality of portions physically separated from one another, such as solid body layers.

SUMMARY

Possible methods for reducing the thickness of a solid body are e.g., polishing or lapping. By means of these methods, material is removed from the solid body by machining. Processing by machining can result firstly in the loss of high-quality solid body material and secondly in wear of the tool, which can result in high costs.

A further possible method for separating a solid body layer from a solid body is a sawing method. In this case, a saw blade or saw wire is brought into contact with the solid body. The saw tool then works its way through the solid body in a machining fashion. The material portions removed by machining are deemed to be a loss in this case. Furthermore, the saw experiences a high degree of wear, as a result of which high costs are incurred.

An embodiment of the present disclosure relates to a method for producing modifications in the interior of a solid body. In an example, the method comprises providing the solid body, wherein the solid body has a first surface and a second surface spaced apart from the first surface in a vertical direction, wherein a thickness and/or a transmittance of the solid body is a function of a lateral position along the first surface and/or along the second surface. The method may comprise exposing a volume portion of the solid body to light waves of different wavelengths via the first surface, wherein the light waves are partly reflected at the first surface and are partly coupled into the solid body and reflected at the second surface. The method may comprise at least partly acquiring light parameters of reflected light waves, of the light waves, by means of a sensor device. The method may comprise ascertaining distance information and/or intensity information from at least a portion of the acquired light parameters. The method may comprise determining a second thickness and/or a second transmittance of the solid body in the volume portion of the solid body based upon the distance information and/or the intensity information. The method may comprise introducing laser radiation into the volume portion of the solid body via the first surface to produce at least one modification in the interior of the solid body at a predefined distance from the second surface, wherein at least one laser parameter of the laser radiation is set at least depending on the second thickness and/or the second transmittance of the volume portion in such a way that the at least one modification is at the predefined distance from the second surface.

An embodiment of the present disclosure relates to an apparatus. In some embodiments, the apparatus is configured to carry out a method for producing at least one modification in the interior of a solid body. In some embodiments, the apparatus comprises a radiation source configured to generate light waves of different wavelengths in a predetermined spectrum. The apparatus comprises a sensor device configured to acquire light parameters of at least a portion of the light waves and an evaluation unit configured to ascertain information from the acquired light parameters, wherein the information comprises at least one of distance information, intensity information, location information, or polarization information. The apparatus comprises a laser device configured to generate laser radiation for producing modifications in the interior of the solid body. The apparatus comprises a driving unit configured to drive the laser device depending on the information ascertained by the evaluation unit (and/or the sensor device). The laser device is configured to alter at least one laser parameter of the laser radiation depending on the information ascertained by the evaluation unit (and/or the sensor device).

Further aspects of the disclosure relate to a computer program product, a programmable circuit and also the use of a method described here for separating a solid body layer from the solid body and/or for producing a semiconductor component.

BRIEF DESCRIPTION OF THE FIGURES

Further embodiments, aims and/or properties will be explained with reference to the following description, the dependent claims and also with reference to the accompanying drawings, which illustrate, sometimes by way of example, exemplary embodiments of methods described here and apparatuses described here. Components which can be used in exemplary embodiments of the method and/or which correspond at least substantially with regard to their function in the figures may be identified here by identical reference signs, although these components need not be designated or elucidated in all figures. The elements, structures and/or components shown in the drawings are not necessarily illustrated in a manner true to scale with respect to one another.

The drawings merely illustrate exemplary embodiments and serve together with the description to elucidate same. It goes without saying that other exemplary embodiments also exist and structural or logical changes can be made, without in so doing departing from the scope defined by the patent claims. The description of the exemplary embodiments is non-limiting in this respect. In particular, elements of exemplary embodiments described below can be combined with elements of other exemplary embodiments from among those described, unless something to the contrary is explicitly evident from the context.

In the figures.

DETAILED DESCRIPTION

One aspect of the present disclosure relates to a method for producing modifications in the interior of a solid body.

This method comprises providing a solid body, for example. The solid body can be a solid-state crystal, such as a semiconductor crystal, or the solid body can comprise a solid-state crystal. By way of example, the solid body comprises a wafer (e.g., a growth substrate) or is a wafer. Alternatively and/or additionally, the solid body can comprise or be a boule and/or ingot. An ingot can be a prism-shaped semiconductor body (e.g., having a hexagonal, circular or elliptic basic area). Wafers can be obtained from an ingot. A boule can be an ingot, such as an ingot composed of predominantly monocrystalline solid body material. The solid body can comprise further components, such as, for example, epitaxially grown layers, metallizations and/or passivation layers, and/or such components can be applied to the solid body.

The solid body has a first surface and a second surface spaced apart from the first surface in a vertical direction. The solid body can extend along lateral directions. Perpendicular to the lateral directions, in the vertical direction, the solid body has the thickness, which is small (e.g., at most 30% or at most 10%) relative to the extent of the solid body in the lateral directions. In the case of an ingot, however, the thickness can also be larger than the lateral extent of the solid body, for example can correspond to the height of the prism. In the case of an ingot and/or boule, the thickness of the solid body can be at least 2 mm (or at least 5 mm or at least 10 mm or at least 1 cm). In the case of a wafer, the thickness can be at least 40 μm and at most 1 mm (or at most 500 μm). By way of example, the first surface and/or the second surface form(s) an angle of at most 10° with a plane spanned by the lateral directions. A lateral position can correspond to a point on a plane spanned by the lateral directions. The lateral position can be specified in Cartesian coordinates and/or in polar coordinates, for example.

In some embodiments, a parameter of the solid body can be a function of a lateral position along the first surface and/or along the second surface. For example, the parameter can vary along the lateral position. The parameter of the solid body can be at least one from: thickness, transmittance, crystal parameter. The crystal parameter can be for example at least one from: orientation of the crystal structure and/or of the crystal of the solid body, polytype variation in the crystal lattice of the solid body, strain states in the solid body, such as in the crystal of the solid body, dislocations (e.g., screw dislocations), defects in the solid body.

It is possible for a thickness of the solid body to be a function of a lateral position along the first surface and/or along the second surface. In some exemplary embodiments, the thickness of the solid body can vary along the lateral position, for example on account of surface unevennesses and/or on account of surfaces not extending in a plane-parallel fashion. The variation can be implemented e.g., in accordance with a so-called Total Thickness Variation (TTV). By way of example, the TTV may be at most 10 μm or at most 7 μm and/or at least 1 μm or at least 3 μm. The solid body can be embodied in a wedge-shaped fashion, for example. By way of example, the solid body may be thicker at one lateral side than at another lateral side. The first and/or the second surface can also be an interface that is not freely accessible within a composite structure. This is the case, for example, if the first and/or the second surface are/is provided with a further component (e.g., a further layer) and/or with component structures.

Alternatively and/or additionally, a transmittance and/or an absorptance and/or a refractive index of the solid body can be a function of a lateral position along the first surface and/or along the second surface. It is possible for the transmittance of the solid body to vary along the lateral directions. By way of example, a dopant concentration of the solid body varies along the lateral directions. The dopant concentration can influence the refractive index and/or the transmittance of the solid body or the material of the solid body. The refractive index and/or the transmittance can also be influenced by further (e.g., partly reflective and/or partly absorbent) components, such as, for example, layers and/or component structures. At one lateral position the solid body can thus have a different transmittance than at another lateral position.

It is furthermore possible, alternatively and/or additionally, for a crystal parameter to be a function of a lateral position along the first surface and/or along the second surface. By way of example, the solid body may comprise local variations of the crystal orientation and/or dislocations and/or polytype variations along the lateral position.

The method can comprise exposing a first volume portion of the solid body to light waves of different wavelengths. The light waves can have at least two (or at least four or at least ten) different wavelengths. It is possible for the light waves to have a maximum of ten or a maximum of twenty or a maximum of fifty or a maximum of one hundred or a maximum of two hundred different wavelengths. In this case "have different wavelengths" can mean that a wavelength spectrum of the light waves in a range of the electromagnetic spectrum has a plurality of peaks and/or is at least partly continuous. By way of example, the light waves may be or comprise polychromatic light. The exposure can be effected continuously or in light pulses spaced apart temporally.

By way of example, light waves of different wavelengths can be spatially and/or temporally separated from one another during the exposing. It is possible for the light waves to be spatially spectrally fanned out and/or to be focused to different extents according to their wavelength. Different wavelength portions of the light waves can then have different axial focus widths and/or different focus positions. In some embodiments, at least two foci of the light waves are situated in the solid body during the exposure. For example, a focus closest to the light source ("innermost focus") and a focus furthest away from the light source ("outermost focus") can exist. The distance between the position of the innermost focus and the position of the outermost focus is also referred to hereinafter as "fan-out". The fan-out can correspond to the measurement range of a sensor assembly or be correlated with the latter.

The fan-out can correspond approximately (i.e., with an accuracy of e.g., ±20% of the fan-out) to the averaged thickness of the solid body (for example at least 200 μm or at least 300 μm and at most 500 μm or at most 400 μm) or even be greater than the averaged thickness of the solid body (e.g., at least 500 μm, such as in the case of a wafer). A larger fan-out can enable a comprehensive measurement of the solid body. However, the fan-out can also be less than the averaged optical thickness of the solid body (for example at least 50 μm or at least 100 μm and at most 200 μm or at most 150 μm). A smaller fan-out can enable for example a more accurate position determination of a plane (e.g., of a detachment plane) within the solid body. The fan-out can be dependent on the refractive index of the medium through which the light waves propagate. The abovementioned values for the fan-out can apply to propagation in air and/or in the solid body.

The light waves are introduced into the volume portion via the first surface, for example, and/or the first surface is exposed to the light waves. The light waves can be partly reflected at the first surface. Furthermore, the light waves can be partly coupled into the solid body and, e.g., partly, reflected at the second surface.

The volume portion extends for example between a first surface portion of the first surface, via which first surface portion the light waves are introduced into the solid body and/or at which first surface portion at least one portion of the light waves is reflected, and a second surface portion of the second surface, at which second surface portion at least one portion of the light waves is reflected. The surface portion of the first surface can have a different lateral extent than the surface portion of the second surface. By way of example, at least the first surface portion may have a lateral extent of at least 1 µm and at most 40 µm, for example at most 20 µm. The volume portion can be determined for example by a size of a light cone of the light waves in the solid body. In other words: the light waves can illuminate a region of the solid body between the first and second surfaces, wherein at least one part of the region or the entire region corresponds to the volume portion. The volume portion can extend obliquely with respect to the vertical direction or along the vertical direction. The surface portion of the first surface and the surface portion of the second surface can at least partly overlap in a vertical projection.

In some exemplary embodiments, it is possible for light parameters of the reflected light waves to be acquired at least partly (e.g., in a majority or completely). The light parameters can be at least one of the following parameters or comprise at least one of the following parameters: wavelength, intensity, wavelength-dependent intensity, polarization, wavelength-dependent polarization, time-dependent intensity. The light parameters can be acquired by a sensor device, such as by means of a sensor of the sensor device. For this purpose, the light waves can be detected by the sensor device and the light parameters can be determined based upon the detected light waves. The sensor device can output the acquired light parameters in the form of signals and/or data. Information, such as distance information and/or intensity information and/or location information and/or polarization information, can be ascertained from the acquired light parameters. However, it is also possible to ascertain other information, such as, for example, defect information (information about dislocations and/or defects) and/or strain information (information about strain sizes) and/or color information (information about the color of defects and/or modifications in the solid body). By way of example, averaged parameters of the solid body in the volume portion can be determined based upon the information ascertained. The ascertaining (of the information and/or the other information) can be performed by means of an evaluation unit. By way of example, for this purpose, the evaluation unit may comprise a programmable circuit and/or a computer and/or may be part of a computer.

The sensor device can comprise at least one confocal chromatic sensor. A confocal chromatic sensor uses chromatic aberration, for example, for determining distance. In general, it may be possible to use a confocal chromatic sensor for measuring parameters of a solid body which can vary depending on the lateral position along the solid body and influence at least one optical property of the solid body in a position-dependent manner. By way of example, the sensor device comprises at least one or exactly one of the following sensor components or a combination of at least two of these sensor components: CCD sensor (also called: CCD chip), photodiode (e.g., one- or two-dimensional photodiode array), microchannel plate (e.g., nitrogen-cooled microchannel plate), active pixel sensor (e.g., two-dimensional active pixel sensor and/or CMOS sensor). The sensor device can be configured to detect at least one portion of the light waves reflected at the first surface and at least one portion of the light waves reflected at the second surface. For example, different spectral components of the light waves reflected at the two surfaces may be ascertained by the sensor device. The detection can be performed in a temporally resolved manner and/or in a spectrally resolved manner and/or in a polarization-resolved manner and/or in a spatially resolved manner.

In some embodiments of the method, ascertaining distance information from at least one portion of the acquired light parameters can be carried out. The distance information can comprise for example information about the distance between the sensor device and the first surface and between the sensor device and the second surface in the volume portion. Alternatively and/or additionally, the distance information can comprise information about the distance between the first surface and the second surface in the volume portion. The thickness of the solid body in the volume portion can be determined based upon the distance information. This sometimes involves pursuing the concept that different spectral components of the light waves propagate in the solid body in different ways and/or have different foci in the solid body. A distance between the sensor device and the first surface and/or the second surface in the volume portion can be ascertained on the basis of a chromatic confocal distance measurement, for example. The distance between the sensor device and the two surfaces can be the distance information or the distance information can be correlated with the distance (for example be directly dependent on the distance).

In one exemplary embodiment, determining a thickness, such as a mean thickness or a root-mean-square thickness, of the solid body in the volume portion of the solid body based upon the information, such as based upon the distance information, can be carried out. In exemplary embodiments of the method, the thickness can be determined for a plurality of volume portions, such as for the entire solid body.

In some exemplary embodiments, the acquired light parameters comprise intensities of the reflected light waves detected by means of the sensor device. Intensity information, for example, can be ascertained from the acquired light parameters. By way of example, the intensity information comprises spectrally resolved intensities of the first reflected light waves and/or of the second reflected light waves.

In some embodiments, the method can comprise determining a transmittance of the solid body in the volume portion of the solid body based upon the intensity information. By way of example, for this purpose, the intensity information is evaluated for at least one, for example for at least two, wavelength(s) of the reflected light waves. Distance information can additionally be consulted for the determination of the transmittance.

In some embodiments, introducing laser radiation into the volume portion of the solid body via the first surface in order to produce at least one modification in the interior of the solid body can be carried out, such as carried out after (and/or before and/or during) performance of one or more of the acts discussed in the foregoing description. It is possible for at least one laser parameter of the laser radiation to be set at least depending on the thickness and/or the transmittance of the volume portion in such a way that the at least one modification is at a predefined distance from the second surface. The laser radiation can thus be configured for producing the modifications depending on the determined distance between the second surface and the first surface in the volume portion.

Setting the laser parameter can be carried out for example by means of a component of the laser device (e.g., an electrically drivable component), a driving unit, by means of an optical unit of the laser device and/or by means of an external optical unit. A correction value for the laser parameter can be determined based upon the thickness and/or the transmittance (and/or any other parameter on the basis of which the laser parameter is set). The correction value can be forwarded for example in real time to the laser device and/or the driving unit and/or can be buffer-stored and be read out at a later point in time by means of the laser device and/or the driving unit. As an alternative and/or in addition to storing the correction values, it is possible for the ascertained thickness and/or the ascertained transmittance to be buffer-stored.

In some exemplary embodiments, the at least one laser parameter, such as a plurality of laser parameters, is/are set depending on the thickness and the transmittance of the volume portion. A precise positioning of the modification, such as of a detachment plane, can be made possible as a result.

Generally, besides the thickness and/or the transmittance, other parameters of the solid body in the volume portion can also be determined on the basis of the light parameters acquired by means of the sensor device. These parameters of the solid body can likewise be used for setting the laser parameters and/or information on the basis of which the laser parameter is set can be ascertained from said parameters. In this regard, it is possible, for example, to ascertain the orientation of the crystal structure of the solid body (e.g., a rotation and/or a tilting) relative to the laser radiation (e.g., relative to the polarization and/or to the Poynting vector of the laser radiation). In some embodiments, such as in the case of anisotropic and/or birefringent solid bodies (e.g., hexagonal SiC, such as 4H-SiC), forming the modification can be dependent on the orientation of the crystal planes in the solid body relative to the spatial orientation (e.g., relative to the Poynting vector) of the laser radiation and/or to the polarization of the laser radiation. The orientation can be ascertained from at least two comparison measurements of the light parameters, for example, in which at least one measurement parameter (e.g., the tilting and/or rotation of the solid body relative to the sensor device and/or the polarization of the light waves) is varied.

It is furthermore possible, alternatively and/or additionally, to determine the refractive index of the volume portion, for example in a wavelength-dependent manner. The refractive index at one wavelength or at a plurality of wavelengths can be determined for example based upon a measurement of the transmittance and/or of the absorptance at said one wavelength or at said plurality of wavelengths. The refractive index can be dependent on the dopant concentration of the solid body in the volume portion. By way of example, the dopant concentration affects the absorption and the transmittance. The laser parameter can be set depending on the refractive index. By way of example, it is possible to adapt the optical unit of the laser device (e.g., the focal length of a lens or a lens system) for the volume portion according to the refractive index in the volume portion in such a way that the distance between the produced modifications and the first surface and/or the second surface is approximately (i.e., with an accuracy of ±20% or even ±10%) identical for different volume portions with different refractive indices (e.g., with different dopant concentrations). For this purpose, by way of example, the distance between lenses within the optical unit and/or the distance between the optical unit and the first surface and/or the second surface can be varied, such as by means of a piezoelement.

It is furthermore possible that using the refractive index ascertained for one or a plurality of wavelengths, it is possible to calculate the refractive index at or at least near the wavelength of the laser radiation, such as on the basis of the Abbe number.

In some embodiments, the at least one modification is produced (at least partly and/or mostly and/or completely) within the same plane (e.g., a detachment plane), wherein said plane is oriented, for example, parallel or approximately parallel (e.g., at an angle of at most 4° or at most 2° or at most 1°) to the second surface. It is possible for a plurality of modifications, such as more than 10 or more than 100 or more than 1000 modifications, to be produced in the solid body in order to produce a detachment plane.

After introducing a multiplicity of modifications, such as in the form of and/or along a detachment plane, a method described here can comprise separating a solid body layer from the solid body. For example, the solid body can be split into at least two parts. By way of example, a part of the split solid body which has component structures may have a smaller thickness than the part of the split solid body which has no component structures. The part of the split solid body which has no component structures can be provided with component structures in further method acts. By way of example, a renewed process of separating a solid body layer can subsequently be carried out. However, it is also possible for neither of the two parts of the split solid body to have component structures.

By way of example, by means of a method described here, it is possible to define very precisely the distance between the second surface and the at least one modification, such as the distance between the second surface and the detachment plane, such that the distance corresponds to the predefined distance (e.g., the distance between the second surface and the at least one modification and/or the detachment plane can be defined with a precision exceeding a threshold precision and/or an accuracy exceeding a threshold accuracy). This can be performed for example by virtue of the fact that surface unevennesses of the first surface and/or thickness fluctuations along the lateral directions may have no or only slight or negligible effects (e.g., less than a threshold amount of effects) on the location of the position production.

Alternatively and/or additionally, by means of a method described here, the transmittance of the solid body can be determined in a position-dependent manner. By ascertaining the transmittance for a volume portion, it is possible to set the laser radiation, such as the intensity and/or focus thereof, in a targeted manner for the volume portion. Consequently, e.g., the effects of a varying transmittance, such as varying dopings and/or dopant concentrations, on the modification production can be limited or at least compensated for. A possible variation of a crystal parameter that can result in different transmittances along the solid body can also be compensated for by this means.

In accordance with some exemplary embodiments, a portion of the light waves is reflected at the first surface (first reflected light waves) and a further portion of the light waves is reflected at the second surface (second reflected light waves). The term "reflected light waves" hereinafter denotes the first reflected light waves and/or the second reflected light waves. A respective portion of the light parameters of the two reflected portions of the light waves can be acquired by the sensor device and evaluated, for example by an evaluation unit. Before the detection by the sensor device for acquiring the light parameters, the two reflected portions of the light waves can be at least partly superimposed. By way of example, a different superimposition than a coherent superimposition may be provided in this case, such as if an interferometric measurement principle is not present. Alternatively and/or additionally, a spatial and/or temporal separation can also be provided. The first and second reflected light waves can have different wavelength components and/or the wavelength components of the first and second reflected light waves can have different temporal and/or spatial profiles. In some exemplary embodiments, the first reflected light waves and the second reflected light waves can be detected separately from one another by means of the sensor device, such as by the same sensor device.

The solid body can be transparent to the light waves of the different wavelengths. The solid body can also be irradiated with other light waves, wherein the light waves can have a wavelength for which the solid body is not transparent. The solid body may be deemed to be transparent to the light waves of a wavelength if the transmittance for this wavelength is at least 60%, such as at least 70% or at least 80% or at least 90%. By way of example, the different wavelengths may be in the visible range of the electromagnetic spectrum (between 380 nm and 780 nm). Alternatively and/or additionally, the wavelengths can be in the near infrared (between 780 nm and 3 μm, such as between 900 nm and 1200 nm).

In accordance with at least one embodiment, the set laser parameter of the laser radiation can comprise or be at least one of the following parameters: focus position (i.e., focal point) of the laser radiation, focus size (i.e., focus width) of the laser radiation, intensity and/or energy of the laser radiation, wavelength (such as peak wavelength) of the laser radiation, intensity distribution in a laser pulse of the laser radiation, pulse duration of a laser pulse of the laser radiation, polarization of the laser radiation, repetition rate of the laser radiation. For example, the laser parameter can comprise the focus position and the intensity of the laser radiation. It is possible for the location of the modification to be settable in a targeted manner by way of the laser parameters mentioned, such as by way of the focus position and the intensity. Setting the laser parameters can be carried out for each laser pulse used to produce one or more modifications and/or for each volume portion in which the at least one modification is produced.

The laser radiation can comprise pulsed portions and/or continuous portions. The laser radiation is typically pulsed. The focus position and/or the focus size can be set by an optical system, for example. The laser parameters can partly depend on one another—by way of example, the wavelength of the laser parameter and the intensity can correlate.

In some exemplary embodiments, the acquired light parameters comprise polarizations or polarization changes of the reflected light waves detected by means of the sensor device. Polarization information of the volume portion can be ascertained from the polarizations. For example, it is possible for the polarization of the reflected light waves to be detected in a spatially resolved manner. Alternatively and/or additionally, polarization information can be provided e.g., in the form of data, wherein the polarization information describes the polarization of the reflected radiation and/or of the laser radiation.

It is possible for the at least one laser parameter for producing the modification in the volume portion to be set depending on the polarization information of the volume portion. The polarization of the laser radiation is typically set depending on the polarization information. By way of example, the at least one laser parameter may be set exclusively depending on the polarization information or additionally depending on other information.

By way of example, from the polarization information and/or from the polarization it is possible to draw conclusions about at least one crystal parameter of the solid body, such as about at least one of the following parameters: orientation of the crystal structure and/or of the crystal of the solid body, polytype variation in the crystal lattice of the solid body, strain states in the solid body, such as in the crystal of the solid body, dislocations (e.g., screw dislocations), defects in the solid body.

Strain states in the solid body, such as in the crystal skeleton of the solid body, can influence for example the formation and/or the propagation of cracks in the material of the solid body. Accordingly, it may be necessary to adapt at least one laser parameter for the production of the modifications in a region of higher strain in comparison with a region of lower strain. The crack formation and/or the crack propagation can alternatively and/or additionally be influenced by the orientation of the crystal relative to the at least one modification produced. The orientation of the modification with respect to that of the crystal can sometimes depend on the polytype of the crystal lattice. Dislocations can likewise influence the crack formation and/or the crack propagation. For example, a birefringence of the material of the solid body in the volume portion can be compensated for by means of a corresponding setting of the laser parameter or of the laser parameters.

For the ascertainment of the crystal parameter from the polarization, in some embodiments, the sensor device can be embodied in a linearly polarized fashion. For example, a polarization (and/or only the polarization) that is defined (e.g., fixedly defined) relative to the sensor device is measured. By measuring at least twice with different directions of incidence of the light waves and/or with different sensor rotations, it is possible to draw conclusions about the crystal parameter. Alternatively and/or additionally, the light waves can be at least partly, such as completely, linearly polarized; in this case, it is possible to rotate the polarization of the light waves. A measurement at least twice then yields a picture regarding the crystal parameter.

In accordance with one embodiment, the light parameters to be acquired can comprise intensities of the light waves that are reflected, and/or detected by means of the sensor device. Intensity information can be ascertained for and/or from the intensities, wherein the at least one laser parameter is set depending on the intensity information. It is possible for the thickness of the solid body in the volume portion to be determined at least partly based upon the intensity information. Alternatively and/or additionally, it is possible for a transmittance of the solid body in the volume portion to be ascertained from the intensity information and for the at least one laser parameter to be set depending on the transmittance. By way of example, the intensity information may comprise the intensities for at least two wavelength components of the reflected light waves (such as of the first and second reflected light waves). By way of example, distances within the solid body can generally be determined based upon the intensity information. Besides the thickness of the volume portion, alternatively and/or additionally, the position of prior damage and/or of an inclusion and/or of a modification that has already been produced can be determined. Furthermore, an absorption in the volume portion can be determined based upon the intensity values (e.g., by means of difference formation). By way of example, a laser parameter required for the volume portion (e.g., the energy and/or the focus position) can additionally be determined therefrom.

In accordance with a further embodiment, the sensor device detects the reflected light waves, e.g., for acquiring the light parameters for determining the intensity signals, at the same volume portion at least or exactly twice. In this case, the reflected light waves can be acquired and/or detected at least twice (for example each time) for different periods. Alternatively and/or additionally, further measurement parameters can be changed (e.g., the polarization of the light waves and/or of the reflected light waves, the distance between the sensor device and the first surface and/or the fan-out of the light waves). The light parameters can be determined by the sensor device depending on the detected light waves. It is likewise possible here for more than two signals (e.g., more than two intensity signals), such as more than two signals per wavelength, to be evaluated for each volume portion. By way of example, the intensity information representing the light waves detected for different periods may be coordinated. By way of example, the distance information can be determined very precisely by means of the different acquisition times (detection times) (e.g., the distance information can be determined with a precision exceeding a threshold precision and/or an accuracy exceeding a threshold accuracy).

The light waves can be emitted, such as continuously, by a radiation source. The radiation source can be arranged at one side of the solid body, such as at and/or above the first surface. A detection time of the sensor device can be settable. The detection time is the time duration during which the reflected light waves are detected and/or acquired. The detection time of the sensor device can be different for different wavelengths. By way of example, the sensor device can be settable and/or set in such a way that the reflected light waves at the same location, such as for the same volume portion, are detected for different detection times at least for two measurements. Alternatively and/or additionally, the volume portion can be exposed to the light waves for different periods (of time). In this regard, e.g., a volume portion could initially be exposed to light waves for a first detection time t1 and be exposed to light waves for a second detection time t2, wherein the first and second detection times can be different. By way of example, it holds true that: $t1*1.1 < t2$ or $t1*1.3 < t2$ or $t1*1.5 < t2$ or $t1*1.8 < t2$ or $t1*2 < t2$ or vice versa, that is to say: $t2*1.1 < t1$ or $t2*1.3 < t1$ or $t2*1.5 < t1$ or $t2*1.8 < t1$ or $t2*2 < t1$.

In some exemplary embodiments, both distance information (e.g., for the determination of the thickness) and intensity information (e.g., for the determination of the transmittance) are ascertained. The determination of the thickness and the determination of the intensity information of the light waves (for example for the determination of the transmittance) can be performed for the same portion of the solid body, such as simultaneously or within a time window of less than 2 seconds or less than 1 second or less than 0.5 second or simultaneously. By way of example, it is thereby possible to measure the respective volume portion within a short time. This can be helpful for producing a plurality of maps, such as an energy map and a thickness map. In this case, the term "map" describes a property of the solid body e.g., in a spatially resolved manner.

Generally it is possible for the thickness and/or transmittance and/or the polarization to be determined in each case for a plurality of volume portions. This applies, mutatis mutandis, to further parameters of the solid body which can be determined by means of the light waves. For example, the thickness and/or the transmittance can be determined for a sufficient number of volume portions that a thickness variation and/or a variation of the transmittance along the entire solid body can be determined. The different volume portions can partly overlap laterally. That is to say that a lateral extent of the light waves at the first surface (corresponds to the lateral extent of the first surface portion) is greater than a center-to-center distance between adjacent volume portions. In terms of volume, for example, the different volume portions have substantially, or to the extent of at least 80% or to the extent of at least 90% or to the extent of at least 95%, the same volume ($mm^3$). Alternatively and/or additionally, the different volume portions can laterally overlap or not overlap; in the latter case, adjacent volume portions can directly adjoin one another or be spaced apart from one another. In this case, a lateral extent of the light waves at the first surface is less than or equal to a center-to-center distance between adjacent volume portions.

In some exemplary embodiments, a center-to-center distance between adjacent volume portions can be at least 150 µm (or at least 250 µm, or at least 400 µm, or at least 800 µm, or at least 1.5 mm). This can be the case both for overlapping volume portions and for volume portions spaced apart from one another. Irrespective of whether the volume portions overlap or adjoin one another or are arranged in a manner spaced apart from one another, an interpolation of the parameters ascertained can be carried out between the volume portions. In some cases, such as in the case of volume portions that are spaced apart, such an interpolation may be required in some exemplary embodiments in order to enable the adaptation of the laser parameters for the production of modifications in a region between the volume portions.

By way of example, for the measurement of different volume portions, the light waves and the solid body are moved relative to one another, wherein the thickness and/or the transmittance of a volume portion illuminated by the light waves are/is determined between two successive movements. It is possible for the thickness and/or the transmittance to be determined for one volume portion and for the at least one modification to be produced in this volume portion (e.g., the thickness and/or the transmittance may be determined before (and/or after) the at least one modification is produced). Alternatively and/or additionally, the respective thickness and/or the respective transmittance can be determined for a plurality of volume portions, e.g., for some and/or all of the volume portions, and the at least one modification can be produced in each of the plurality of volume portions (e.g., the respective thickness and/or the respective transmittance for the plurality of volume portions may be determined before (and/or after) the at least one modification is produced in each of the plurality of volume portions).

In accordance with an embodiment, the method may comprise exposing, at least after the production of the modification in the volume portion, the volume portion of the solid body to the light waves of different wavelengths and/or to further light waves of different wavelengths via the first surface. The light waves and/or the further light waves are partly reflected at the first surface and partly coupled into the solid body and reflected at the at least one modification. In some embodiments, light parameters of the reflected light waves and/or of the reflected further light waves are at least partly acquired by a sensor device and/or a further sensor device.

The further sensor device can be embodied like the sensor device (e.g., the further sensor device may comprise one or more components that are equivalent and/or functionally equivalent to one or more components of the sensor device). Alternatively and/or additionally, the further sensor device can comprise a different optical unit than the sensor device. In general, information, such as, for example, location information, intensity information and/or polarization information, can be ascertained from the light parameter(s) acquired by the further sensor device. The further light waves can be embodied like the light waves (e.g., the further light waves may have one or more properties that are equivalent and/or functionally equivalent to one or more properties of the light waves). Alternatively and/or additionally, the further light waves can differ from the light waves in at least one of the following properties: distance between the light source for generating the further light waves and the first surface and/or the second surface; position of the foci of the different wavelength components in the solid body; fan-out of the light waves; polarization of the light waves.

Location information can be ascertained from at least one portion of the light parameters acquired by the sensor device and/or the further sensor device. A distance between the at least one modification and the first surface and/or between the at least one modification and the second surface in the volume portion of the solid body can be determined based upon the location information. As a result, by way of example, the position of one or more modifications in the interior of the solid body is able to be checked. In this case, the location information can be identical to the distance information and/or can be determined analogously to the distance information. The disclosure above in respect of the distance information thus applies, mutatis mutandis, to the location information, and vice versa.

Alternatively and/or additionally, color information can be ascertained from a portion of the light parameters acquired by the sensor device and/or the further sensor device. A quality of the modification can be determined based upon the color information. The color information can correspond to a luster image of the at least one modification, such as of the detachment plane. The luster image can have different color components. It may be possible to ascertain from the color of the luster image whether the energy and/or the intensity of the laser radiation were/was chosen correctly. Furthermore, it is possible to check whether a sufficient number of modifications were introduced in the solid body. The latter can alternatively and/or additionally also be ascertained from the location information. The information mentioned above can be stored as reference data and be reused for the setting of the laser parameters during the production of modifications in a subsequent solid body. Alternatively and/or additionally, the same solid body can be treated once again with the laser radiation, wherein the energy and/or the intensity and/or the focus position of the laser radiation can be adapted according to the information from the luster image during the repeated treatment. By way of example, it is thereby possible to correct modifications that were introduced with excessively low energy and/or intensity, and/or additionally to introduce modifications in the case of an insufficient number of modifications.

For ascertaining the color information it may be necessary to measure the at least one modification in a first measurement with the light waves. In a second measurement following that, the at least one modification can be measured with further light waves, which are different than the light waves. The further light waves are different than the light waves such as in terms of their fan-out and/or in terms of the focus position of identical wavelengths. It is possible for the further light waves to be generated by the same light source as the light waves. The fan-out can be changed for example by adapting an optical unit of the light source. Alternatively and/or additionally, the focus position can be varied by displacing the light source relative to the solid body. However, it is also possible for the further light waves to be generated by a further light source, which is different than the light source.

In accordance with an embodiment, the sensor device and a radiation source used to generate the light waves are arranged at a closer distance with respect to the first surface than with respect to the second surface. If provision is made of a plurality of sensor devices and/or a plurality of radiation sources by means of which the light waves are generated, then they can be arranged at a closer distance with respect to the first surface than with respect to the second surface. The second surface can have for example components, such as a layer (e.g., a metallic coating or a passivation), an immersion liquid and/or component structures, for which reason the light waves can be coupled in better via the first surface.

In accordance with an embodiment, with respect to the solid body, such as the concrete solid body, the distance information and/or the intensity information and/or the thickness and/or the transmittance and/or the light parameters at least as a function of the lateral position and/or of the volume portion along the first surface and/or the second surface are stored as reference data on a data carrier. In an alternative and/or additional exemplary embodiment, it is possible for different items of information than those mentioned to be stored as reference data (e.g., location information, polarization information, crystal parameters, luster image, and/or color information). The lateral position and/or the volume portion can be stored in the form of spatial coordinates (e.g., Cartesian coordinates or polar coordinates) and/or in the form of a surface portion of the first surface and/or in a manner identifiable in some other way (e.g., numbering of surface portions and/or of volume portions). It is also possible to store 3D spatial coordinates and/or volume portions and/or other identification data for the location.

In accordance with an embodiment, modifications are produced in a solid body and reference data in respect thereof are provided and/or output and/or stored and modifications are subsequently produced in a further solid body or on a further plane in the solid body, wherein the at least one laser parameter of the laser radiation for the production of the modifications in the further solid body or on the further plane is additionally set at least depending on at least one portion of the stored or provided or output reference data. The reference data concerning the solid body or first solid body treated beforehand, such as directly beforehand, can be stored. The configuration of the laser radiation can be effected during a treatment of a solid body depending on a combination of information (e.g., a combination of data and/or signals), wherein part of the information is the information ascertained during a treatment of the solid body (e.g., by means of the sensor device and/or the evaluation unit) and part of the information Is the stored data concerning one or more partly or completely treated solid bodies. In this case, completely treated should be understood to mean that the modification production for producing a detachment plane in the solid body has been concluded. However, it may be the case that further modifications are produced on a different plane in the same solid body.

In accordance with one embodiment, the solid body comprises silicon carbide (SiC), such as 4H-SiC, or consists of silicon carbide. In this case, the fact that a solid body consists of a material should generally be understood in such a way that the solid body, besides the material of which it consists, can comprise production-dictated impurities and/or dopants. By way of example, the solid body may comprise SiC to the extent of more than 80% (mass) or to the extent of more than 99% (mass). In an example, the solid body can be understood to be only the portion between the first surface and the second surface provided that this consists of the same material. In other words: additional components (e.g., coatings, passivations, component structures, etc.) may be present, which differ from the material of the solid body. In some embodiments, the solid body can be part of a composite structure. Alternatively and/or additionally, the solid body can comprise or consist of at least one of the following materials: gallium nitride (GaN), silicon (Si), sapphire ($Al_2O_3$), gallium (III) oxide ($Ga_2O_3$), gallium arsenide (GaAs).

In accordance with one embodiment, the solid body comprises component structures of a semiconductor component at the second surface. The component structures can be embodied as at least partly light-nontransmissive and/or at least partly reflective for the light waves of the different wavelengths. Alternatively and/or additionally, the solid body can comprise at least one layer which is light-nontransmissive and/or reflective for the light waves, such as e.g., a metallization, at the second surface. The modification production can be performed with component structures already having been applied. The solid body portion (e.g., in the form of a further solid body layer) remaining at the applied component structures and/or the layer can be very thin (e.g., a thickness of the layer may be less than a threshold thickness) in this case since a sufficient strength can be achieved by means of the applied component structures and/or the layer. By way of example, as a result, the total material yield can be increased and/or grinding of the solid body portion can be reduced (e.g., a grinding loss can be avoided).

In accordance with an embodiment, a use of a method according to any of the abovementioned subjects for separating a solid body layer from the solid body and/or for producing a semiconductor component is provided. The semiconductor component can comprise at least one of the component structures mentioned above. In this case, the semiconductor component is for example an electrical semiconductor component, such as for switching currents. The semiconductor component comprises, for example, a pn junction. By way of example, the semiconductor component can be a diode (e.g., a Schottky diode), a field effect transistor (e.g., a MOSFET) and/or an IGBT or comprise at least one of the components mentioned.

In accordance with an embodiment, an apparatus is provided. In some embodiments, the apparatus can be configured and/or provided for carrying out a method mentioned above (and/or one or more other acts presented herein). That is to say that all features disclosed in association with the method may also be disclosed for the apparatus, and vice versa.

The apparatus can comprise at least one holding device for orienting the solid body in a defined manner. Alternatively and/or additionally, the apparatus can comprise a radiation source (e.g., a broadband radiation source, a white light source) for generating light waves of different wavelengths in a predefined spectrum. The radiation source can be for example a broadband radiation source which emits polychromatic light in the visible and/or infrared range of the electromagnetic spectrum. Exemplary components which can be used as or in a radiation source comprise at least one from: a white light source, a light emitting diode (e.g., an emissive luminescent diode or a laser diode having a wavelength conversion phosphor), a nonlinear fiber, a halogen lamp, a Xenon lamp. The apparatus can additionally comprise a sensor device for acquiring light parameters of at least one portion of the light waves. For acquiring the light parameters, the sensor device can be configured for detecting light waves for ascertaining the light parameters.

Furthermore, the apparatus can comprise an evaluation unit for ascertaining at least one of the following items of information from the light parameters: distance information, intensity information, location information, polarization information, color information. The evaluation unit can comprise a computing unit. By way of example, the evaluation unit may comprise a programmable circuit and/or may be a computing unit. The evaluation unit can comprise parts of a computer. In addition and/or as an alternative to the evaluation unit, a computing unit can be provided.

It is furthermore possible for the apparatus to comprise a laser device for generating laser radiation for producing modifications in the interior of the solid body. The apparatus can comprise a driving unit for driving the laser device depending on the information ascertained by the evaluation unit (and/or the sensor device). The driving unit can comprise at least one from: an electrical regulator, a voltage supply, a current supply. The driving unit can comprise or be a programmable logic controller and/or can be driven at least partly by means of a programmable unit (such as e.g., a microchip, and/or as part of a computer). The items of information ascertained can be at least one from: distance information, intensity information, location information, polarization information. By way of example, a parameter of the solid body in the volume portion can be at least partly determined based upon the information ascertained. The laser device can be configured to alter at least one laser parameter of the laser radiation depending on the information ascertained by the evaluation unit (and/or the sensor device). For this purpose, the laser device (and/or optionally the driving unit) can comprise at least one electrically drivable component (e.g., an electro-optical component, such as e.g., an electro-optical modulator and/or a Pockels cell; an electromechanical component, such as e.g., a piezo-element; and/or an electric motor) and/or an acousto-optical element. Additionally and/or alternatively, the optical unit of the laser device can comprise at least one optical component which enables the laser parameter to be set. The electrically drivable component and/or the optical component can be set depending on the information ascertained by the evaluation unit (and/or the sensor device) and/or depending on at least one parameter of the solid body in the volume portion.

By way of example, the optical unit of the laser device may comprise at least one lens, such as a plurality of lenses, e.g., an objective. Here and hereinafter, lens is deemed to be any component which results in a displacement of the focus of the laser radiation (such as a concave mirror and/or an additional path distance). At least one component of the optical unit or the entire optical unit can be mounted in such a way that the position of the component, and thus the focus of the laser radiation, is displaceable by means of an electrically drivable component (e.g., by means of a piezo-element).

In accordance with an embodiment, the radiation source and the sensor device form a sensor assembly (also called "first sensor assembly" in some exemplary embodiments).

The sensor assembly can be arranged in a fixed relative position with respect to the laser device. It may thereby be possible, for example, to align the individual components of the assembly precisely with respect to one another. For example, the assembly is enclosed in sections by a housing. By way of example, the assembly can thereby be protected against damage and contamination. Furthermore, the entire assembly can be exchangeable.

In accordance with an embodiment, at least one second sensor assembly is provided. The second sensor assembly likewise comprises a radiation source and a sensor device. The first sensor assembly, the second sensor assembly and a constituent of the optical unit of the laser device, by means of which constituent the laser radiation is focused into the solid body, can be arranged in a straight line. It is possible for the constituent of the optical unit of the laser device to be arranged between the sensor assemblies. By means of an apparatus resulting therefrom, a precise measurement of the solid body and thus a precise production of modifications can be made possible. Furthermore, this apparatus can enable the position of the modifications produced to be checked. It is thus possible to perform very fast and precise processing with checking carried out continuously, for example (e.g., the processing may be performed at a speed exceeding a threshold speed and/or with a precision exceeding a threshold precision).

Further exemplary embodiments relate to a programmable circuit. The programmable circuit can for example comprise a field programmable gate array (FPGA) or be an FPGA. The circuit can have an input, an output and a processing unit. The input can be configured to receive sensor signals from the sensor device. By way of example, for this purpose, the sensor device can have an output coupled to the input of the circuit.

The processing unit can be configured to ascertain information from the sensor signals of the sensor device. For example, the programmable circuit can be programmed in such a way that the processing unit can ascertain information from the sensor signals of the sensor device. The information ascertained can be signals and/or data, for example. By way of example, the information ascertained comprises at least one from: distance information, intensity information, location information, polarization information, color information. Alternatively and/or additionally, the information ascertained can comprise drive signals for driving a driving unit of a laser device and/or drive signals for driving the driving unit of a laser device can be ascertained from at least one portion of the information ascertained. Alternatively and/or additionally, the information can comprise laser parameters which are intended to be available by a laser device.

The output can be configured to output information ascertained by the circuit. By way of example, the information ascertained is output to a further component within the circuit, for example to a further processing unit. Alternatively and/or additionally, the information ascertained can be forwarded in the form of output signals to a further component outside the circuit. At least one portion of the information ascertained can be output for example to a driving unit of a laser device. By way of example, for this purpose, the output of the circuit is coupled to an input of the driving unit.

In some embodiments, the programmable circuit can be provided and/or configured to determine a transmittance and/or a thickness and/or a crystal parameter in a volume portion of a solid body. The programmable circuit can be configured in such a way that sensor signals originating from a sensor device are able to be evaluated by means of the programmable circuit. The sensor signals can describe and/or comprise light parameters of light waves detected by means of the sensor device.

In some exemplary embodiments, the programmable circuit (such as the processing unit) can exhibit real-time capability. In this context, "real-time capability" means that the data rate of the programmable circuit (i.e., the rate at which the programmable circuit ascertains the information from the sensor signals and outputs it via the output) corresponds at least to the data rate at which the information is made available at the input. By way of example, the clock rate of the programmable circuit (such as of the processing unit) is at least 50 kHz, such as at least 1 MHz. The data rate at which the information is made available at the input can depend on the data rate at which the light parameters are measured, and on the number of pixels of the sensor device. If there are a large number of sensors in the sensor device, the total number of pixels should be taken into consideration. By means of a programmable circuit, it may be possible to process a very large amount of information (e.g., an amount of information that is greater than a threshold amount of information) in a very short time (e.g., a duration of time that is less than a threshold duration of time), such as in real time.

A computer program product is provided as a further embodiment, wherein the computer program product comprises instructions. The instructions can be provided and/or configured for programming a programmable circuit described here. Alternatively and/or additionally, the instructions can be provided and/or configured for driving an apparatus for carrying out a method described here. For example, the instructions can have the effect that an apparatus described here or an alternative apparatus carries out a method described here.

Exemplary embodiments of a method described here and of an apparatus described here will be explained in greater detail on the basis of the schematic arrangement shown in FIG. 1.

Figure 1:
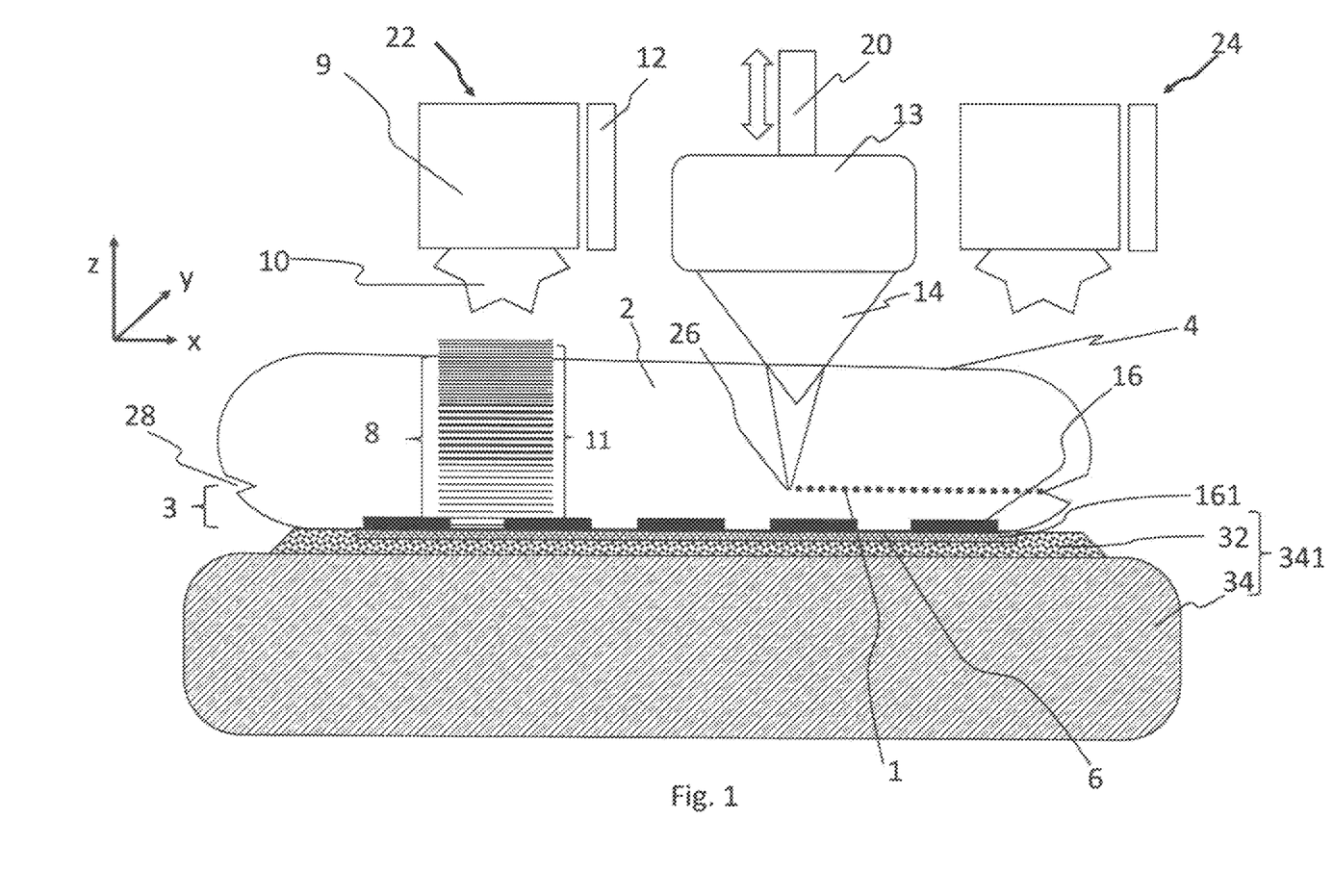
FIG. 1 schematically shows an arrangement in accordance with one exemplary embodiment by means of which modifications can be produced in solid bodies, and FIG. 2 schematically shows measurement values such as are able to be output e.g., by the sensor device illustrated in FIG. 1.

The arrangement shown in FIG. 1 comprises, purely by way of example, a solid body 2, a sensor assembly 22, a laser device 13 and a holding device 341 for holding the solid body 2. The sensor assembly 22, the laser device 13, the radiation source 9 and the holding device 341 can be part of an apparatus for carrying out a method for producing at least one modification 1 in the interior of a solid body.

The solid body 2 has a first surface 4 and a second surface 6 spaced apart from the first surface 4 in a vertical direction z. A distance between the first surface 4 and the second surface 6 corresponds to a thickness of the solid body 2. The thickness of the solid body 2 is a function of a lateral position x,y along the first surface 4 and/or along the second surface 6. In the present exemplary embodiment, the solid body 2 is embodied as slightly wedge-shaped purely by way of example, such that the thickness of the solid body 2 varies along the lateral position x,y. However, other variations of the thickness of the solid body 2 along the lateral position x,y are also conceivable. By way of example, the (e.g., two-dimensional) function of the thickness along the lateral position x,y corresponds to a wavelike function, a straight line, a quadratic function or an irregular function. Alternatively and/or additionally, the thickness of the solid body along the lateral position x,y can be constant—the function of the thickness is then a constant.

Alternative or additional embodiments of the solid body 2 are conceivable in which the solid body has a transmittance and/or crystal parameter that vary(-ies) along the lateral position x,y. Other parameters of the solid body 2 can also vary along the lateral position x, y.

The holding device 341 can comprise a carrier device 34 and a connection layer 32. By way of example, the connection layer 32 comprises a potting compound, an adhesive and/or a foam. The connection layer 32 can be configured to mechanically connect the carrier device 34 and the solid body 2 to one another, such as by way of a mechanically and/or chemically nondestructively releasable connection. The carrier device 34 can be embodied as a temporary carrier which for example is removed again from the solid body 2 in subsequent process acts and/or can be used for the mechanical mounting of a new solid body 2. The carrier device 34 can be embodied as mechanically stabilizing for the solid body 2, such as mechanically stabilizing for a part of the solid body 2 that is to be separated. The carrier device 34 can be formed with glass, metal, a semiconductor and/or plastic. By way of example, the carrier device 34 is a glass carrier, a film or a chuck or comprises one of the aforesaid items. The connection layer 32 may be optional, such as in the case where the carrier device 34 is a film.

At a side of the solid body 2 facing the holding device 341 and/or at the second surface 6, the solid body 2 can comprise component structures 16. Furthermore, one or more metallization(s) 161 can be provided, which can serve for electrically contacting the component structures 16. The component structures 16 can be embodied at the second surface 6 of the solid body 2. The component structures 16 and/or the metallization 161 can at least partly be embedded into the connection layer 32 and/or directly adjoin the connection layer 32.

The sensor assembly 22 of the apparatus can comprise at least one radiation source 9 and a sensor device 12. As an alternative to the exemplary embodiment illustrated, the sensor device 12 and the radiation source 9 can also be embodied structurally separately from one another and/or in a manner spaced apart from one another and/or independently of one another. The radiation source 9 can be configured to emit light waves 10 of different wavelengths in a predetermined electromagnetic spectrum. By way of example, the radiation source 9 is a white light source and/or emits broadband light. The sensor device 12 can be configured to acquire light parameters of at least one portion of the light waves 10, 11 that are emitted by the radiation source 9 and possibly reflected, for example to detect the light waves 10, 11.

The laser device 13 can comprise a laser source, for example. The laser device 13 can be configured for generating laser radiation 14, such as in the near infrared. The laser device 13 can comprise an optical unit (e.g., a lens, an objective, a telescope, a deflection mirror and/or a diffractive optical element) by means of which the laser radiation can be directed and/or focused into the interior of the solid body 2. At least one laser parameter of the laser radiation 14 is settable. The at least one laser parameter can be set for example by means of at least one of the optical units and/or by changing parameters of the laser source of the laser device 13 (e.g., in the case of the pulse duration or the wavelength).

Optionally, a second sensor assembly 24 can be provided, wherein the second sensor assembly 24 can likewise comprise a radiation source 9 and a sensor device 12. Alternatively and/or additionally, a second radiation source and a second sensor device can be provided separately from one another. The radiation source 9 and/or the sensor device 12 of the second sensor assembly 24 can be embodied like the radiation source 9 and/or the sensor device 12 of the (first) sensor assembly 22 (e.g., the radiation source 9 of the second sensor assembly 24 may comprise one or more components that are equivalent and/or functionally equivalent to one or more components of the radiation source 9 of the (first) sensor assembly 22 and/or the sensor device 12 of the second sensor assembly 24 may comprise one or more components that are equivalent and/or functionally equivalent to one or more components of the sensor device 12 of the (first) sensor assembly 22). Alternatively and/or additionally, each or both of the radiation source 9 and/or the sensor device 12 of the second sensor assembly 24 may differ from the radiation source 9 and/or the sensor device 12 of the (first) sensor assembly 22. It is possible for the first sensor assembly 22, the second sensor assembly 24 and a constituent of the optical unit of the laser device 13, by means of which constituent the laser radiation 14 is directed and/or focused into the solid body 2, to be arranged in a straight line. The constituent of the optical unit of the laser device 13 can be arranged between the two sensor assemblies 22, 24. The constituent of the optical unit can be for example a lens or a deflection mirror and/or a diffractive optical element. However, other optical units from among those mentioned above are also conceivable. However, the apparatus can also be embodied without a second sensor assembly 24.

In a method for producing a modification 1 in the solid body 2, light waves 10 of different wavelengths can be introduced into a volume portion 8 of the solid body 2. The volume portion 8 can correspond to or correlate with that part of the solid body 2 which is illuminated by the light waves 10. In the volume portion 8, the solid body has a thickness, a transmittance and/or a crystal parameter. Each volume portion 8 can comprise a first surface portion of the first surface 4 and extend adjacent thereto as far as the second surface 6, where the volume portion 8 can comprise a second surface portion of the second surface 6. By way of example, the thickness/transmittance/crystal parameter in the volume portion 8 corresponds to a thickness/transmittance/crystal parameter of the solid body averaged over a lateral extent of the volume portion 8. By way of example, the first surface 4 is exposed to the light waves 10.

At least one portion of the light waves 10 can be reflected at the first surface 4 and at least one further portion of the light waves 10 can be coupled into the solid body 2. A portion of the light waves 10 coupled into the solid body can be at least partly reflected at the second surface 6. By way of example, the light waves 10 may be reflected at the second surface 6 at least partly at the component structures 16 and/or the metallization 161. The light waves 11 reflected at the first surface 4 and at the second surface 6 can be at least partly detected by the sensor device 12. For example, light parameters of the reflected light waves 11 are acquired by the sensor device 12.

It is possible for different wavelengths and/or polarizations of the light waves 10 in the solid body 2 to experience a different propagation in the vertical direction z and/or a different absorption in and/or reflection at the solid body 2 (indicated by a varying hatching within the volume portion 8 in FIG. 1). For example, the light waves can be fanned out. In this regard, it is possible, for example, for the focus position of shorter wavelengths (illustrated by closer hatching) to be situated nearer the first surface 4 than the focus position of longer wavelengths (illustrated by wider hatching). The light waves 11 reflected at the first surface 4 and at the second surface 6 can be superimposed. Temporal differences between the spectral components and/or the polarization components can result from the wavelength-dependent propagation. From such differences it is possible to draw conclusions for example about the distance between the first surface 4 and the second surface 6 and/or the transmittance and/or the crystal parameters and/or the position of the modifications 1 in the volume portion 8. By way of example, a confocal chromatic distance measurement can be carried out.

In general, information (e.g., distance information, intensity information, polarization information, location information and/or color information) can be ascertainable from the light parameters acquired by means of the sensor device 12. The information can be used for determining a parameter of the solid body 2 in the volume portion 8 (e.g., thickness, transmittance, crystal parameter) and/or a parameter of the modifications 1 in the volume portion 8 (e.g., position, luster image).

The method furthermore involves producing modifications 1 in the volume portion 8 of the solid body 2 by means of the laser device 13. By way of example, for this purpose, the laser radiation 14 is focused into the solid body 2, wherein the material of the solid body 2 is damaged (e.g., is melted) at the focus position 26. By way of example, the damage is effected by means of a multi-photon process. In this case, at least one laser parameter of the laser radiation 14 is set depending on the previously ascertained parameter (e.g., thickness, transmittance, crystal parameter) in the volume portion 8 in such a way that the at least one modification 1 is at a predefined distance from the second surface 6. The laser radiation 14 can be introduced into the solid body 2 via the first surface 2. Depending on said parameter, e.g., a deflection of a part of the laser device 13, such as of a part of the optical unit, in the vertical direction z can be effected by means of a drive device 20.

The method can comprise analyzing a multiplicity of volume portions 8, wherein distance information can be ascertained for each volume portion 8. The individual volume portions 8 can be laterally adjacent to one another (e.g., adjoin one another) or overlap in part or in a majority. It is possible for the position (such as the lateral position x, y) and/or the spatial location in the solid body 2 to be ascertained for each of the volume portions 8. By way of example, a first volume portion 8 can be examined by means of a sensor assembly 22, while laser radiation 14 for producing at least one modification 1 can be introduced into a further volume portion 8 depending on the acquired light parameters and the ascertained distance information, such as the ascertained thickness in the further volume portion 8.

A method described here makes it possible, for example, to introduce a multiplicity of modifications 1, such as along a modification plane, into the solid body 2. In general, the predefined distance of each of the modifications 1 with respect to the second surface 6 can be identical for some and/or all the volume portions 8 of the solid body 2.

The first surface 4 is illustrated as inclined relative to the second surface 6 purely by way of example in FIG. 1 (so-called wedge-shaped form). The resultant thickness variation can be compensated for by a method described here for example in such a way that in a thicker region the modifications 1 are at a greater distance from the first surface 4 than in a thinner region of the solid body 2. A modification plane which is at a homogeneous distance from the second surface 6 can be produced as a result. The modification plane can be produced parallel or substantially parallel to the second surface 6. The modifications 1 can be arranged or produced nearer the second surface 6 than the first surface 4. The distance between the modifications 1 and the second surface 6 can be smaller (e.g., at most 90% or at most 80%) than the distance between the modifications 1 and the first surface 4.

The solid body 2 has an optional notch 28 in the edge region. Said notch 28 can be produced fully circumferentially at the level of the modifications 1. By way of example, the modification plane can thereby be extended as far as the edge of the solid body 2.

In some exemplary embodiments, the modification 1 can be a modification of silicon carbide (SiC). The modification 1 can be a locally delimited phase transformation of SiC. Locally delimited means e.g., that the phase transformation can be smaller than 1 $mm^3$ or smaller than 0.1 $mm^3$ or smaller than 0.01 $mm^3$. The phase transformation can be effected at the focus 26 of the laser radiation 14 and/or can result from a multi-photon excitation. The modifications 1 can partly be superimposed and/or be spaced apart from one another. The modifications 1 can give rise to compressive stresses in the solid body 2, as a result of which the latter can crack, for example can crack subcritically, in the region of the modification 1. Subcritically can mean that a crack (also called: microcrack) of a maximum length of less than 5 mm, such as of less than 2 mm or less than 1 mm, forms.

The cracks are able to be linked together for example by introducing a force into the solid body 2. The linking of the cracks can result in a solid body layer being separated from the solid body 2. As a result of the linking of the cracks, a solid body layer 3 is able to be separated from the solid body 2, such as along the detachment plane. In this case, the solid body layer 3 can be thinner than the remaining solid body that results from the separation of the solid body layer 3 from the solid body 2. After the separation, the regions of the solid body 2 which have the cracks are then exposed, for example.

The force can be introduced into the solid body 2 e.g., by means of waves, such as sound waves, and/or by a mechanical loading and/or by producing stresses. By way of example, in order to produce stresses and/or a mechanical loading, a polymer layer (such as a polymer layer comprising polydimethylsiloxane (PDMS)) is arranged at the first surface 4 and subsequently cooled. In some exemplary embodiments, the polymer layer can be cooled to a temperature that is below a glass transition temperature of at least one component of the polymer layer.

Figure 2:
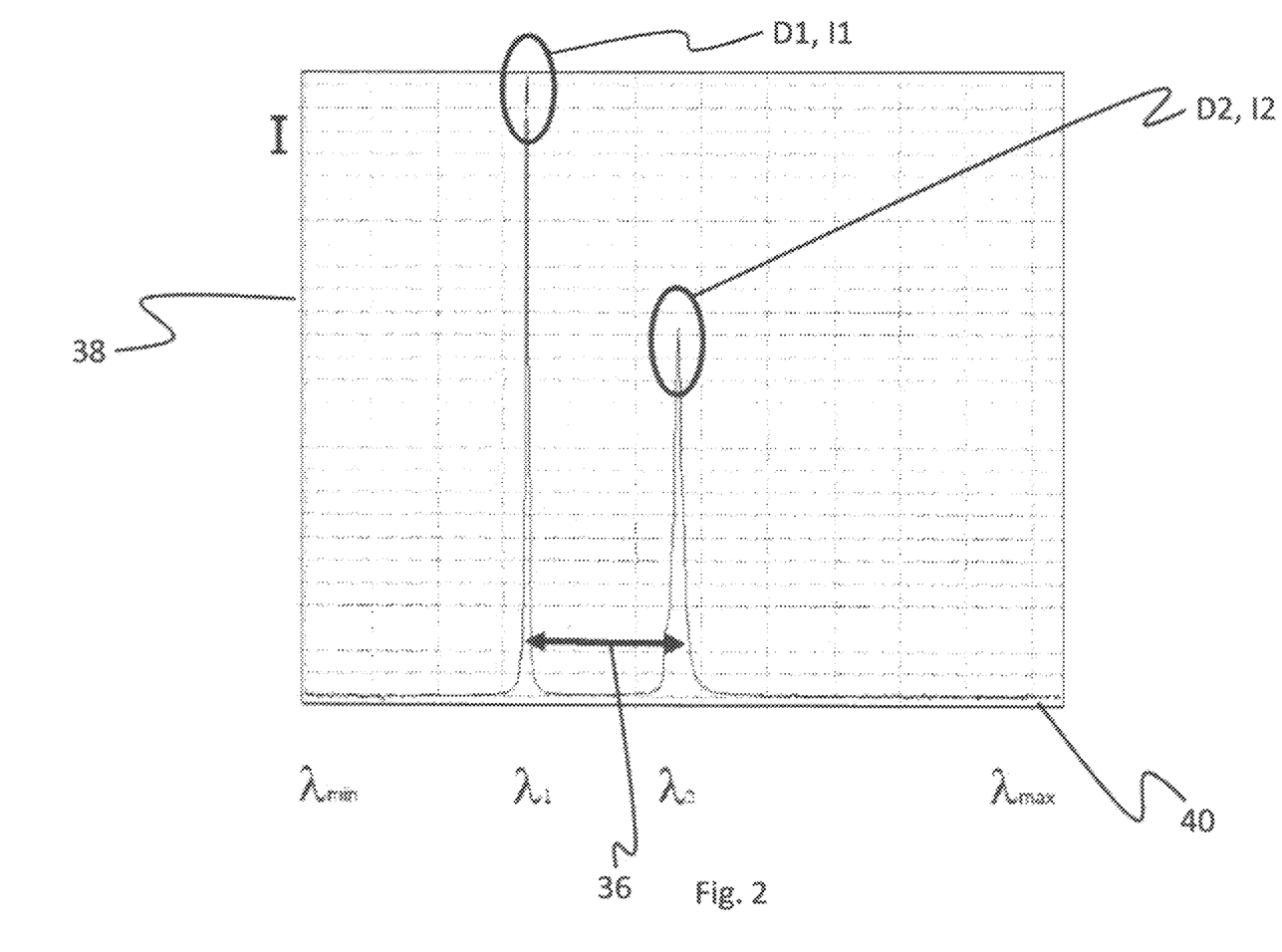

FIG. 2 shows an exemplary illustration of values detected and/or acquired by means of the sensor device 12. By way of example, the values (here: wavelength-dependent intensity) correspond to the light parameters or are part of the light parameters or at least one portion of the light parameters is ascertained from the values. In this case, the intensity 38 of the reflected and detected light waves 11 is plotted as a function of the wavelength of the reflected and detected light waves 11. At a first wavelength $\lambda_1$ the spectrum has a first peak having a first intensity $I_1$. At a second wavelength $\lambda_2$ the spectrum has a second peak having a second intensity $I_2$. The first peak can correspond to a portion of the reflected light waves 11 that is reflected at the first surface 4, and the second peak can correspond to a portion of the reflected light waves 11 that is reflected at the second surface 6. By way of example, a first distance D1 with respect to the first surface 4 is able to be ascertained from the first peak (such as the latter's spectral position, i.e., first wavelength $\lambda_1$) and a second distance $D_2$ with respect to the second surface 6 is able to be ascertained from the second peak (such as the latter's spectral position, i.e., second wavelength $\lambda_2$)—in each case only from the spectral position of the respective peak or in combination with further light parameters. The difference between the first intensity $I_1$, and the second intensity $I_2$ can correspond to the absorption in the volume portion 8. From the absorption, alone or in combination with further light parameters, it is possible to ascertain for example the transmittance in the volume portion 8.

The spectral distance 36 between the two peaks can be correlated with the thickness in the volume portion 8. Depending on this information, the focus position 26 of the laser radiation 14 can be set very precisely (e.g., the focus position 26 can be set with a precision exceeding a threshold precision and/or an accuracy exceeding a threshold accuracy), such as in order to compensate for a variation of the thickness along the lateral position x,y.

Although specific embodiments have been illustrated and described herein, those skilled in the art will recognize that the specific embodiments shown and described can be replaced by a multiplicity of alternative and/or equivalent configurations, without departing from the scope of protection of the present disclosure. The application is intended to cover any adaptations or variations of the specific embodiments discussed herein.

It may be appreciated that combinations of one or more embodiments described herein, including combinations of embodiments described with respect to different figures, are contemplated herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

While the subject matter has been described with reference to illustrative embodiments, this description is not intended to be construed in a limiting sense. Various modifications and combinations of the illustrative embodiments, as well as other embodiments of the present disclosure, will be apparent to persons skilled in the art upon reference to the description. It is therefore intended that the appended claims encompass any such modifications or embodiments.

The invention claimed is:

1. A method for producing modifications in an interior of a solid body, the method comprising:
   providing the solid body, wherein the solid body has a first surface and a second surface spaced apart from the first surface in a vertical direction, wherein a thickness of the solid body is a function of a lateral position at least one of along the first surface or along the second surface;
   exposing a volume portion of the solid body to light waves of different wavelengths via the first surface, wherein the light waves are partly reflected at the first surface and are partly coupled into the solid body and reflected at the second surface;
   detecting reflected light waves, of the light waves, at the same volume portion at least twice by means of a sensor device, wherein the reflected light waves are detected at the same volume portion at least twice for different periods;
   at least partly acquiring light parameters of the reflected light waves, wherein the acquired light parameters comprise polarizations of the reflected light waves;
   ascertaining distance information from at least a portion of the acquired light parameters;
   determining one or more parameters based upon the polarizations, wherein the one or more parameters comprise at least one of an orientation of a crystal of the solid body, a polytype variation in a crystal lattice of the solid body, one or more strain states in the solid body, one or more dislocations in the solid body or one or more defects in the solid body;
   determining a second thickness of the solid body in the volume portion of the solid body based upon the distance information; and
   introducing laser radiation into the volume portion of the solid body via the first surface to produce at least one modification in the interior of the solid body at a predefined distance from the second surface, wherein at least one laser parameter of the laser radiation is set at least depending on the second thickness of the volume portion such that the at least one modification is at the predefined distance from the second surface and at least one laser parameter of the laser radiation is set at least depending on the one or more parameters determined based upon the polarizations.

2. The method of claim 1, wherein:
the at least partly acquiring light parameters comprises determining intensities of the reflected light waves detected by means of the sensor device; and
the acquired light parameters comprise the intensities of the reflected light waves, the method comprising:
ascertaining intensity information from the intensities, wherein the at least one laser parameter is set depending on the intensity information.

3. The method of claim 2, wherein:
the intensity information representing the light waves acquired for different periods is coordinated.

4. The method of claim 2, wherein:
the determination of the second thickness and the determination of the intensities of the light waves are performed for the volume portion of the solid body within a time window of less than 2 seconds.

5. The method of claim 1, wherein:
the at least one laser parameter comprises energy of the laser radiation and a focus position of the laser radiation.

6. The method of claim 1, comprising:
exposing, at least after the production of the at least one modification in the interior of the solid body, the volume portion of the solid body to at least one of the light waves of different wavelengths or to second light waves of different wavelengths via the first surface, wherein at least one of the light waves or the second light waves are partly reflected at the first surface and are partly coupled into the solid body and reflected at the at least one modification;
at least partly acquiring second light parameters of second reflected light waves, of at least one of the light waves or the second light waves, by means of at least one of the sensor device or a second sensor device;
ascertaining location information from at least a portion of the acquired second light parameters; and
determining, based upon the location information, at least one of:
a first distance between the at least one modification and the first surface in the volume portion of the solid body; or
a second distance between the at least one modification and the second surface in the volume portion of the solid body.

7. The method of claim 1, comprising:
arranging the sensor device and a radiation source used to generate the light waves at a closer distance with respect to the first surface than with respect to the second surface.

8. The method of claim 1, wherein:
the solid body comprises component structures of a semiconductor component at the second surface.

9. A method for producing modifications in an interior of a solid body, the method comprising:
providing the solid body, wherein the solid body has a first surface and a second surface spaced apart from the first surface in a vertical direction, wherein a transmittance of the solid body is a function of a lateral position at least one of along the first surface or along the second surface;
exposing a volume portion of the solid body to light waves of different wavelengths via the first surface, wherein the light waves are partly reflected at the first surface and are partly coupled into the solid body and reflected at the second surface;
at least partly acquiring light parameters of reflected light waves, of the light waves, by means of a sensor device;
ascertaining intensity information from at least a portion of the acquired light parameters;
determining a second transmittance of the solid body in the volume portion of the solid body based upon the intensity information ascertained in association with the reflected light waves;
setting at least one laser parameter based upon the second transmittance of the volume portion; and
introducing laser radiation, with the at least one laser parameter, into the volume portion of the solid body via the first surface to produce at least one modification in the interior of the solid body at a predefined distance from the second surface, wherein the at least one modification is at the predefined distance from the second surface.

10. The method of claim 9, comprising:
detecting the reflected light waves at the volume portion at least twice by means of the sensor device for the at least partly acquiring light parameters, wherein:
the reflected light waves are detected at least twice for different periods; and
the intensity information representing the light waves acquired for different periods is coordinated.

11. The method of claim 9, wherein:
a thickness of the solid body is a function of a lateral position at least one of along the first surface or along the second surface, the method comprising:
ascertaining distance information from at least a portion of the acquired light parameters; and
determining a second thickness of the solid body in the volume portion of the solid body based upon the distance information, wherein the at least one laser parameter is set depending on the second thickness of the volume portion.

12. The method of claim 9, wherein:
the at least one laser parameter comprises energy of the laser radiation and a focus position of the laser radiation.

13. The method of claim 9, wherein:
the at least partly acquiring light parameters comprises determining polarizations of the reflected light waves detected by means of the sensor device; and
the acquired light parameters comprise the polarizations of the reflected light waves, the method comprising:
ascertaining polarization information of the volume portion from the polarizations, wherein the at least one laser parameter of the laser radiation is set depending on the polarization information.

14. The method of claim 9, comprising:
exposing, at least after the production of the at least one modification in the interior of the solid body, the volume portion of the solid body to at least one of the light waves of different wavelengths or to second light waves of different wavelengths via the first surface, wherein at least one of the light waves or the second light waves are partly reflected at the first surface and are partly coupled into the solid body and reflected at the at least one modification;
at least partly acquiring second light parameters of second reflected light waves, of at least one of the light waves or the second light waves, by means of at least one of the sensor device or a second sensor device;

ascertaining location information from at least a portion of the acquired second light parameters; and
determining, based upon the location information, at least one of:
- a first distance between the at least one modification and the first surface in the volume portion of the solid body; or
- a second distance between the at least one modification and the second surface in the volume portion of the solid body.

15. The method of claim 9, comprising:
arranging the sensor device and a radiation source used to generate the light waves at a closer distance with respect to the first surface than with respect to the second surface.

16. The method of claim 9, wherein:
the solid body comprises component structures of a semiconductor component at the second surface.

17. The method of claim 9, comprising:
at least one of separating a solid body layer from the solid body or producing a semiconductor component using the at least one modification.

18. A method for producing modifications in an interior of a solid body, the method comprising:
providing the solid body, wherein the solid body has a first surface and a second surface spaced apart from the first surface in a vertical direction, wherein at least one of a thickness of the solid body or a transmittance of the solid body is a function of a lateral position at least one of along the first surface or along the second surface;
exposing a volume portion of the solid body to light waves of different wavelengths via the first surface, wherein the light waves are partly reflected at the first surface and are partly coupled into the solid body and reflected at the second surface;
at least partly acquiring light parameters of reflected light waves, of the light waves, by means of a sensor device;
ascertaining at least one of distance information or intensity information from at least a portion of the acquired light parameters;
determining at least one of a second thickness of the solid body in the volume portion of the solid body based upon the distance information or a second transmittance of the solid body in the volume portion of the solid body based upon the intensity information;
introducing laser radiation into the volume portion of the solid body via the first surface to produce at least one modification in the interior of the solid body at a predefined distance from the second surface, wherein at least one laser parameter of the laser radiation is set at least depending on at least one of the second thickness of the volume portion or the second transmittance of the volume portion such that the at least one modification is at the predefined distance from the second surface;
exposing, at least after the production of the at least one modification in the interior of the solid body, the volume portion of the solid body to at least one of the light waves of different wavelengths or to second light waves of different wavelengths via the first surface, wherein at least one of the light waves or the second light waves are partly reflected at the first surface and are partly coupled into the solid body and reflected at the at least one modification;
at least partly acquiring second light parameters of second reflected light waves, of at least one of the light waves or the second light waves, by means of at least one of the sensor device or a second sensor device;
ascertaining location information from at least a portion of the acquired second light parameters; and
determining, based upon the location information, at least one of:
- a first distance between the at least one modification and the first surface in the volume portion of the solid body; or
- a second distance between the at least one modification and the second surface in the volume portion of the solid body.

* * * * *